(12) United States Patent
Kim et al.

(10) Patent No.: US 10,586,687 B2
(45) Date of Patent: Mar. 10, 2020

(54) METHOD AND APPARATUS FOR REPRODUCING COMPONENT OF SEMICONDUCTOR MANUFACTURING APPARATUS, AND REPRODUCED COMPONENT

(71) Applicant: TOKAI CARBON KOREA CO., LTD, Gyeonggi-do (KR)

(72) Inventors: Ki Won Kim, Gyeonggi-do (KR); Hyeong Uk Roh, Gyeonggi-do (KR); Jong Sung Yun, Gyeonggi-do (KR); Won Pyo Hong, Gyeonggi-do (KR)

(73) Assignee: TOKAI CARBON KOREA CO., LTD. (KR)

( * ) Notice: Subject to any disclaimer, the term of this patent is extended or adjusted under 35 U.S.C. 154(b) by 462 days.

(21) Appl. No.: 15/394,491

(22) Filed: Dec. 29, 2016

(65) Prior Publication Data
US 2017/0345624 A1 Nov. 30, 2017

(30) Foreign Application Priority Data
May 25, 2016 (KR) .................. 10-2016-0064388

(51) Int. Cl.
*H01J 37/32* (2006.01)
*C23C 16/02* (2006.01)
(Continued)

(52) U.S. Cl.
CPC .... *H01J 37/32642* (2013.01); *C23C 16/0227* (2013.01); *C23C 16/0254* (2013.01);
(Continued)

(58) Field of Classification Search
CPC ..... C23C 16/00; C23C 16/02; C23C 16/0227; C23C 16/0254; C23C 16/04;
(Continued)

(56) References Cited

U.S. PATENT DOCUMENTS 7,691,277 B2 * 4/2010 Suzuki .............. H01J 37/32623
134/1
7,829,183 B2 11/2010 Forrest et al. ............... 428/212
(Continued)

FOREIGN PATENT DOCUMENTS

| CN | 104022018 | 9/2014 | ............. H01L 21/02 |
| JP | 10083969 | 3/1998 | ............. H01L 21/26 |

(Continued)

OTHER PUBLICATIONS

Korean Office Action (no translation) issued in application No. 10-2016-0064388, dated Jul. 29, 2016 (8 pgs).
(Continued)

*Primary Examiner* — William P Fletcher, III
(74) *Attorney, Agent, or Firm* — Hayes Soloway P.C.

(57) ABSTRACT

A method and apparatus for reproducing a component of a semiconductor manufacturing apparatus, and a reproduced component are provided. The method may include a preparing step of preparing a damaged component of a semiconductor manufacturing apparatus, a first cleaning step of cleaning the damaged component, a masking step of masking at least one of areas including an undamaged part of the damaged component, a reproduced part forming step of forming a reproduced part on the damaged component using a chemical vapor deposition (CVD), a post-grinding step of grinding the damaged component with the reproduced part, and a second cleaning step of cleaning the damaged component with the reproduced part.

16 Claims, 6 Drawing Sheets

(51) Int. Cl.
  *C23C 16/56* (2006.01)
  *C23C 16/04* (2006.01)
  *C23C 16/44* (2006.01)

(52) U.S. Cl.
  CPC ........ *C23C 16/042* (2013.01); *C23C 16/4401* (2013.01); *C23C 16/56* (2013.01); *H01J 37/32009* (2013.01); *H01J 37/3255* (2013.01); *H01J 37/32532* (2013.01); *H01J 2237/334* (2013.01)

(58) Field of Classification Search
  CPC ..... C23C 16/042; C23C 16/325; C23C 16/44; C23C 16/458; C23C 16/56; H01L 21/02; H01L 21/02041; H01L 21/02043; H01L 21/02046; H01L 21/02049; H01L 21/02052; H01L 21/02054; H01L 21/02079; H01L 21/02096; H01L 21/02104; H01L 21/02167; H01L 21/02296; H01L 21/02299; H01L 21/02301; H01L 21/02318; H01L 21/02529; H01L 21/02658; H01L 21/027
  USPC ....... 427/249.15, 255.28, 255.393, 282, 307, 427/355
  See application file for complete search history.

(56) References Cited

U.S. PATENT DOCUMENTS

| | | | | |
|---|---|---|---|---|
| 8,221,579 | B2 | 7/2012 | Nagayama et al. | ....... 156/345.1 |
| 8,475,622 | B2* | 7/2013 | Nagayama | .......... C23C 16/0227 |
| | | | | 156/345.1 |
| 8,685,855 | B2 | 4/2014 | Nakayama et al. | .......... 438/680 |
| 2011/0308459 | A1* | 12/2011 | Yoshimoto | .......... C23C 16/4581 |
| | | | | 118/721 |
| 2013/0157067 | A1* | 6/2013 | Kawamoto | ............. C04B 41/87 |
| | | | | 428/446 |
| 2013/0273313 | A1 | 10/2013 | Sun et al. | ............... C03C 17/23 |

FOREIGN PATENT DOCUMENTS

| | | | |
|---|---|---|---|
| JP | H11269646 | 10/1999 | ............. C04B 41/87 |
| JP | 2004134690 | 4/2004 | ......... H01L 21/3065 |
| JP | 2005243988 | 9/2005 | ......... H01L 21/3065 |
| JP | 2006140238 | 6/2006 | ......... H01L 21/3065 |
| JP | 2006253200 | 9/2006 | ......... H01L 21/3065 |
| JP | 2007513257 | 5/2007 | ................ C23C 16/01 |
| JP | 2007537447 | 12/2007 | ............. G01C 21/16 |
| JP | 2011018894 | 1/2011 | ......... H01L 21/3065 |
| JP | 2012049220 | 3/2012 | ......... H01L 21/3065 |
| JP | 2015523458 | 8/2015 | ............. C04B 41/87 |
| JP | 2016-255604 | 5/2019 | ............. C23C 16/42 |
| KR | 101593921 | 2/2016 | ............. H01L 21/02 |
| KR | 101593921 B1 * | 2/2016 | |
| TW | 400546 | 8/2000 | ........... H01L 21/205 |
| TW | 201130390 | 9/2011 | ............. C23C 16/32 |
| TW | 201131010 | 9/2011 | ............. C23C 16/54 |
| TW | 201209912 | 3/2012 | ......... H01L 21/3065 |
| WO | WO2005114106 | 12/2005 | ............. G01C 21/16 |

OTHER PUBLICATIONS

Taiwanese Office Action (w/machine translation) issued in application No. 105144247, dated Mar. 6, 2018 (18 pgs).
Japanese Office Action (w/translation) issued in application No. 2016-255604, dated Nov. 28, 2018 (6 pgs).
Japanese Office Action issued in application No. 2016-255604, dated Jan. 31, 2018 (9 pgs).
Japanese Office Action (w/translation) issued in application No. 2016-255604, dated May 16, 2019 (8 pgs).

* cited by examiner

FIG. 7
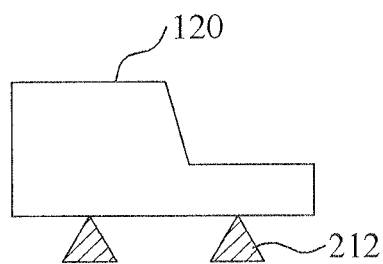
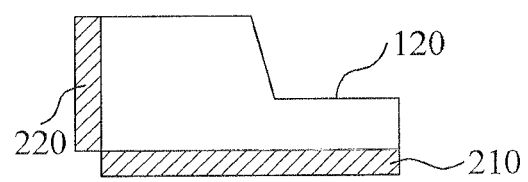
FIG.8A
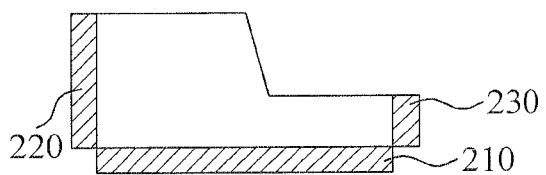
FIG.8B

METHOD AND APPARATUS FOR REPRODUCING COMPONENT OF SEMICONDUCTOR MANUFACTURING APPARATUS, AND REPRODUCED COMPONENT

CROSS-REFERENCE TO RELATED APPLICATIONS

This application claims the benefit of Korean Patent Application No. 10-2016-0064388 filed on May 25, 2016, in the Korean Intellectual Property Office, the disclosure of which is incorporated herein by reference.

BACKGROUND

1. Field of the Invention

One or more example embodiments relate to a method and apparatus for reproducing a component of a semiconductor manufacturing apparatus, and a reproduced component, and more particularly, relate to a method and apparatus for reproducing a component of a semiconductor manufacturing apparatus which are available in a semiconductor manufacturing process by reproducing a damaged component of a dry etching apparatus using plasma, and relate to a reproduced component.

2. Description of the Related Art

Generally, a plasma etching scheme used in a semiconductor manufacturing process is one of dry etching processes and is performed to etch a target using gas. In the plasma etching scheme, etching gas may be injected into a reaction vessel and may be ionized and the ionized gas may be jetted onto a wafer surface, to physically and chemically remove the wafer surface. By using the plasma etching scheme, etching may be easily controlled, a productivity may increase, and a fine pattern with dozens of nanometers (nm) may be formed. Thus, the plasma etching scheme has been widely used.

In the plasma etching scheme, parameters may need to be considered for uniform etching. The parameters may include, for example, a density and a thickness of a layer to be etched, a temperature and energy of etching gas, an adhesion of a photoresist, a state of a wafer surface, or a uniformity of etching gas. In particular, adjusting of a high frequency (for example, a radio frequency (RF)) used to perform etching by ionizing etching gas and jetting the ionized gas onto a wafer surface may be regarded as an important parameter. Uniformly applying of a high frequency may be essential for a uniform energy distribution on an entire surface of a wafer to be actually etched, which may not be achieved by only adjusting an output of the high frequency and may depend greatly on a shape of each of a stage and an anode as high frequency electrodes and a focus ring configured to substantially fix a wafer.

The focus ring may function to prevent plasma from being diffused in a reaction chamber of a plasma etching apparatus under a severe condition in which plasma is present, and function to confine the plasma around a wafer in which etching is to be performed. Accordingly, the focus ring may be exposed to the plasma at all times and sputtered by positive ions in the plasma, and a surface of the focus ring may be etched. When the focus ring is not replaced at an appropriate time, it may be difficult to smoothly perform an etching process due to an increase in an amount of by-products created by etching the focus ring. Thus, the etched focus ring may need to be replaced by a new focus ring at preset intervals, and may be discarded.

Also, under a plasma condition, other components exposed to the plasma in the reaction chamber may also be etched. To precisely etch a wafer, the other components damaged due to etching may also need to be replaced by new components at preset intervals, which may lead to an increase in production costs of semiconductor products. The replaced components may also be discarded.

SUMMARY

The present disclosure is to solve the foregoing problems, and an aspect of the present disclosure is to provide a method and apparatus for reproducing a component of a semiconductor manufacturing apparatus, and a reproduced component which may contribute to an environmental preservation by reducing industrial wastes caused by discarding consumable components, for example, replaceable focus rings, of the semiconductor manufacturing apparatus and may reduce production costs of a final semiconductor product.

However, the problems to be solved in the present disclosure are not limited to the foregoing problems, and other problems not mentioned herein would be clearly understood by one of ordinary skill in the art from the following description.

According to an aspect, there is provided a method of reproducing a component of a semiconductor manufacturing apparatus, the method including a preparing step of preparing a damaged component of a semiconductor manufacturing apparatus, a first cleaning step of cleaning the damaged component, a masking step of masking at least one of areas including an undamaged part of the damaged component, a reproduced part forming step of forming a reproduced part on the damaged component using a chemical vapor deposition (CVD), a post-grinding step of grinding the damaged component with the reproduced part, and a second cleaning step of cleaning the damaged component with the reproduced part.

The method may further include, between the preparing step and the first cleaning step, a pre-grinding step of grinding the damaged component. The masking step may include masking at least one of the areas by a jig.

The masking step may include masking at least one undamaged surface among a bottom surface, an outer surface and an inner surface of the damaged component.

The pre-grinding step, the post-grinding step or both may include cutting or grinding the damaged component with a diamond wheel.

The pre-grinding step may include cutting or grinding a damaged part of the damaged component by a thickness of 0.8 millimeters (mm) to 1.7 mm.

The post-grinding step may include acquiring a surplus part by cutting the reproduced part. The surplus part may be ground to manufacture another component of the semiconductor manufacturing apparatus.

The second cleaning step may include a first physical or chemical cleaning step, a heat treatment cleaning step, and a second physical or chemical cleaning step.

A temperature of the heat treatment cleaning step may range from 800° C. to 1400° C.

According to another aspect, there is provided an apparatus for reproducing a component of a semiconductor manufacturing apparatus, the apparatus including a CVD chamber, and a mask located in the CVD chamber and configured to mask an area including an undamaged part of a damaged component.

The mask may include a jig.

The jig may include a base jig configured to support one surface of undamaged surfaces of the damaged component. An area of a contact surface between the base jig and the surface supported by the base jig may be less than or equal to an area of the surface.

The base jig may be a point jig.

The jig may further include an additional jig configured to support another undamaged surface.

The additional jig may include an outer circumferential jig configured to support an outer surface of the damaged component, and an inner circumferential jig configured to support an inner surface of the damaged component.

The base jig and the additional jig may be integrally formed.

A shape of a surface of the additional jig in contact with the damaged component may correspond to a shape of the other damaged surface.

According to another aspect, there is provided a reproduced component of a semiconductor manufacturing apparatus as a consumable component, including a reproduced part and a nonreproduced part.

The reproduced part, the nonreproduced part or both may be resistant to plasma.

The reproduced part, the nonreproduced part or both may include silicon carbide (SiC).

The reproduced component may be a component of a plasma etching apparatus and may include at least one of a ring, an electrode and a conductor.

The method may be performed using the apparatus.

The reproduced component may be reproduced using the method.

The reproduced component may be reproduced using the apparatus.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 7 is a cross-sectional view of a focus ring and a point jig configured to support one of undamaged surfaces of the focus ring according to an example embodiment;

FIG. 8A is a cross-sectional view of a damaged focus ring with a structure in which a bottom surface and an outer surface of the damaged focus ring are masked by a base jig and an outer circumferential jig, respectively, according to an example embodiment;

FIG. 8B is a cross-sectional view of a damaged focus ring with a structure in which a bottom surface, an outer surface and an inner surface of the damaged focus ring are masked by a base jig, an outer circumferential jig and an inner circumferential jig, respectively, according to an example embodiment;

DETAILED DESCRIPTION

Figure 1:
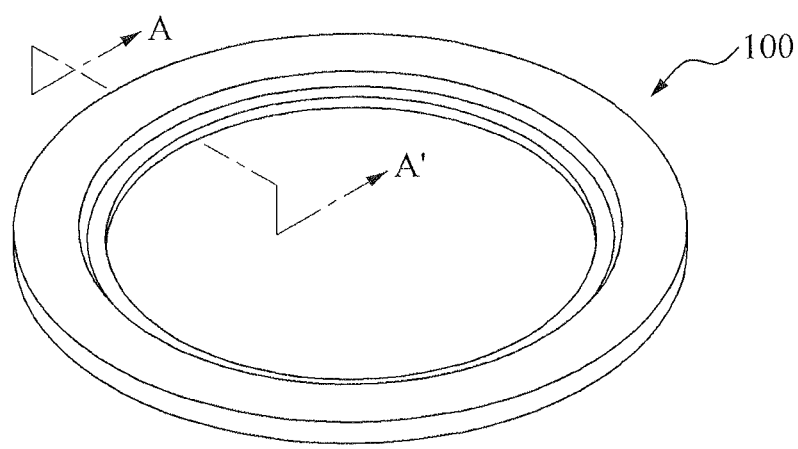
FIG. 1 is a perspective view illustrating a focus ring used in a plasma etching apparatus of a semiconductor production process.

Hereinafter, a method and apparatus for reproducing a component of a semiconductor manufacturing apparatus, and a reproduced component will be described in detail with reference to example embodiments and drawings. Various alterations and modifications may be made to the example embodiments and drawings. When describing the example embodiments with reference to the accompanying drawings, like reference numerals refer to like elements, and a repeated description related thereto will be omitted. Here, the example embodiments are not construed as limited to the disclosure and should be understood to include all changes, equivalents, and replacements within the idea and the technical scope of the disclosure. When it is determined detailed description related to a related known function or configuration they may make the purpose of the present disclosure unnecessarily ambiguous in describing the present disclosure, the detailed description will be omitted here.

Also, terms used herein are defined to appropriately describe the example embodiments and thus may be changed depending on a user, the intent of an operator, or a custom of a field to which the present disclosure pertains. Accordingly, the terms must be defined based on the following overall description of this specification. Like reference numerals present in the drawings refer to the like elements throughout.

It will be understood throughout the whole specification that when a component is referred to as being "on" another component, the component can be directly on another component or an intervening component between the two components.

Also, it will be understood throughout the whole specification that, unless specified otherwise, when one part "includes" or "comprises" one component, the part does not exclude other components but may further include the other components.

FIG. 1 is a perspective view of a focus ring 100 that is one of components of a semiconductor manufacturing apparatus and used in a plasma etching apparatus of a semiconductor production process. The focus ring 100 may have various shapes based on types of apparatuses employing the focus ring 100. In FIG. 1, the focus ring 100 may have a stepped shape between an upper surface and a lower surface, and may include an inclined surface that connects the upper surface and the lower surface. In the present disclosure, a component of a semiconductor manufacturing apparatus may be referred to as a "component," and a focus ring may be provided as an example of a component.

Figure 2:
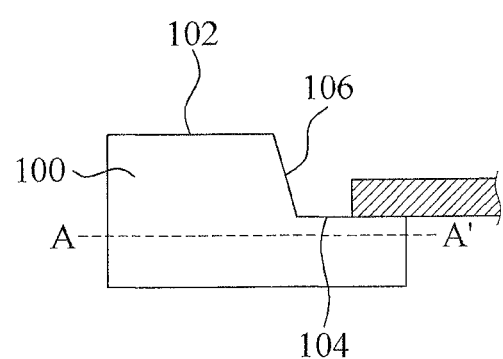
FIG. 2 is a cross-sectional view of a structure of a focus ring in which a wafer is mounted in a plasma etching apparatus of a semiconductor production process.

FIG. 2 is a cross-sectional view of a structure of the focus ring 100 in which a wafer is mounted in a plasma etching apparatus of a semiconductor production process. The wafer may be mounted over a portion or all of a lower surface 104 of the focus ring 100 based on a structure of a plasma etching apparatus. The wafer and the focus ring 100 may be exposed to plasma and etched in a chamber of the plasma etching apparatus. A part that is not covered by the wafer among an upper surface 102, an inclined surface 106 and the lower surface 104 of the focus ring 100 may be intensively etched. Accordingly, components, for example, focus rings, of a semiconductor manufacturing apparatus exposed to plasma in the chamber of the plasma etching apparatus may be damaged, and may need to be periodically replaced.

According to an example embodiment, a method of reproducing a component of a semiconductor manufacturing apparatus may be provided. The method may include a preparing step of preparing a damaged component of a semiconductor manufacturing apparatus, a first cleaning step of cleaning the damaged component, a masking step of masking at least one of areas including an undamaged part of the damaged component, a reproduced part forming step of forming a reproduced part on the damaged component using a chemical vapor deposition (CVD), a post-grinding step of grinding the damaged component with the reproduced part, and a second cleaning step of cleaning the damaged component with the reproduced part. In the present disclosure, the term "reproducing" may refer to "repairing."

Figure 3:
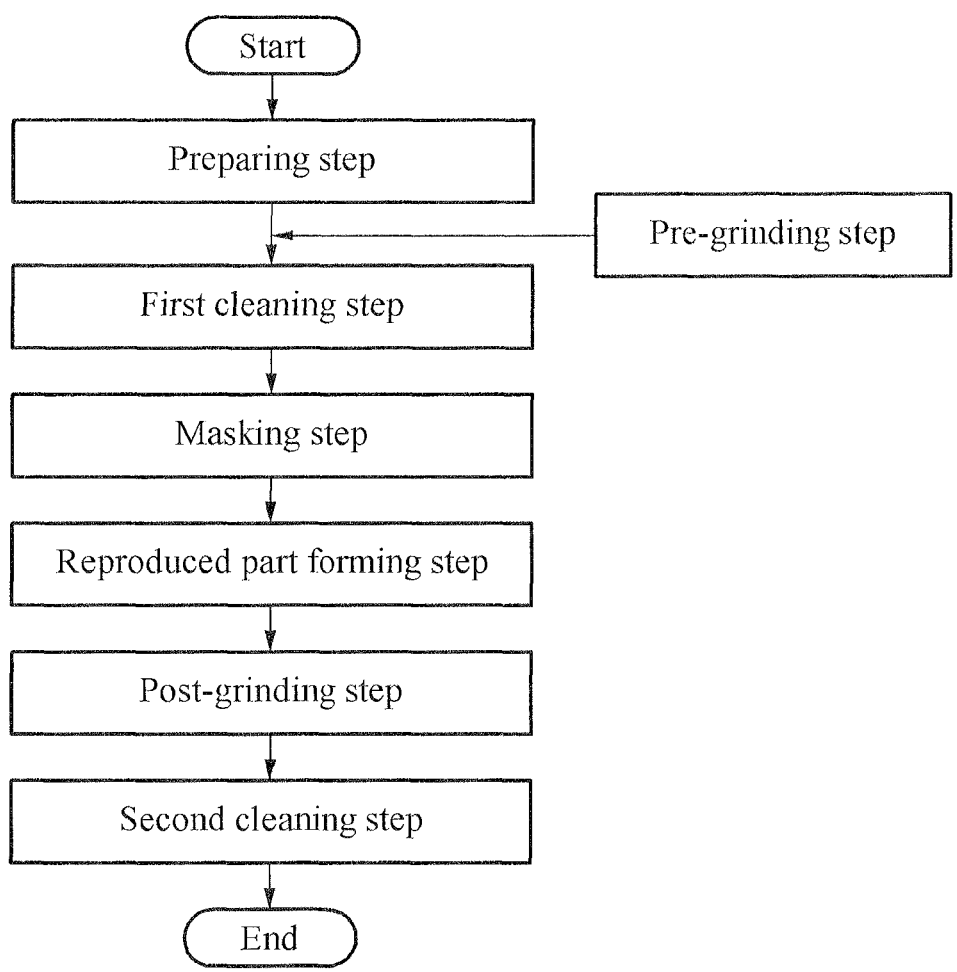
FIG. 3 is a flowchart illustrating a process of generating a reproduced component of a semiconductor manufacturing apparatus according to an example embodiment.

The method may further include, between the preparing step and the first cleaning step, a pre-grinding step of grinding the damaged component. The pre-grinding step may refer to uniformly grinding a damaged part of the damaged component by removing an uneven surface of the damaged part by at least a depth of the damaged part. The pre-grinding step may be performed to prevent a quality difference between a reproduced component and an original component that is not damaged due to non-uniform deposition of a reproduced part when the reproduced part is deposited directly on the uneven surface of the damaged part. FIG. 3 is a flowchart illustrating a process of generating a reproduced component of a semiconductor manufacturing apparatus according to an example embodiment.

FIGS. 4A, 4B, 4C, 4D, 4E, 4F and 4G are diagrams illustrating a process of generating a reproduced focus ring that is one of the reproduced components according to an example embodiment.

Figure 4:
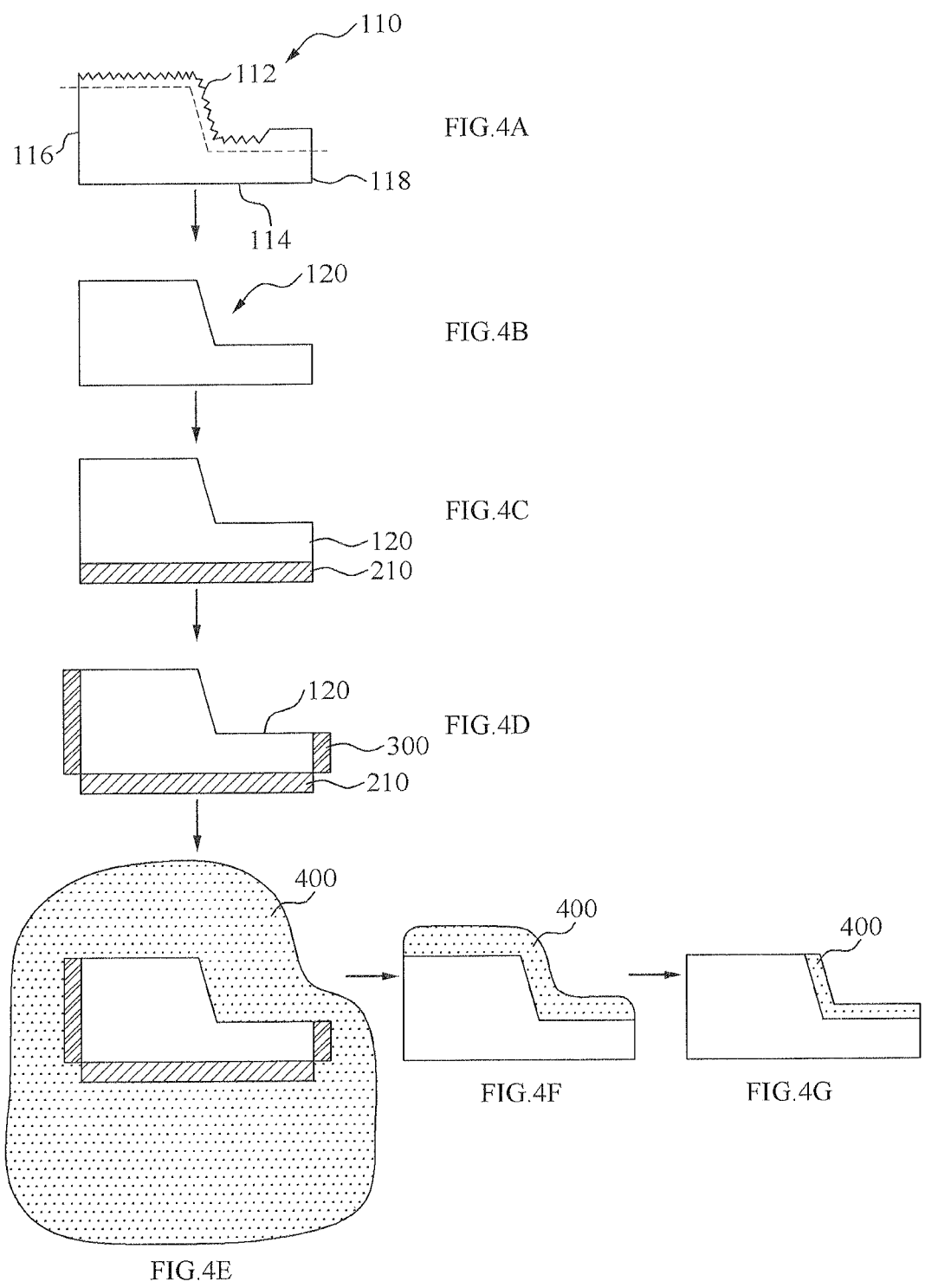
FIGS. 4A, 4B, 4C, 4D, 4E, 4F and 4G are diagrams illustrating a process of generating a reproduced component of a semiconductor manufacturing apparatus according to an example embodiment.

FIG. 4A is a cross-sectional view of a damaged focus ring 110 including a part 112 damaged by plasma etching in a dry etching apparatus, and unetched parts. The unetched parts may include, for example, a bottom surface 114, an outer surface 116 and an inner surface 118 that are not etched because the bottom surface 114, the outer surface 116 and the inner surface 118 are not exposed to plasma. The damaged part 112 of FIG. 4A may correspond to, for example, the upper surface 102, the inclined surface 106 and a portion of the lower surface 104 that is not covered by a wafer in the focus ring 100 of FIG. 2 that is not damaged. When a wafer is seated on the lower surface 104 as shown in FIG. 2, a surface of a portion of a lower surface of the damaged focus ring 110 may not be damaged as shown in FIG. 4A because plasma is not in direct contact with the portion of the lower surface. Based on a structure of an apparatus in a chamber, the bottom surface 114, the outer surface 116 and the inner surface 118 may each have an additional undamaged surface.

In the preparing step, the damaged component may be cleaned in advance to remove impurities on a surface of the damaged component.

When the damaged component is cleaned, a pre-grinding step may be performed to flatten a part of the damaged component that is unevenly etched and damaged as shown in FIG. 4A. Accordingly, uniform deposition may be induced in the reproduced part forming step. FIG. 4B is a cross-sectional view of a focus ring 120 with a surface that is flattened through the pre-grinding step. In the following description, the focus ring 120 may refer to a damaged component with a surface flattened through the pre-grinding step.

In the present disclosure, the pre-grinding step is not particularly limited, and may include all operations of uniformly grinding a part of a damaged component which is to be formed by depositing a reproduced part.

In the first cleaning step, impurities on the surface of the damaged component may be removed. When the pre-grinding step is included in the process as described above, surface impurities generated in the pre-grinding step may be removed in the first cleaning step. In the present disclosure, the first cleaning step is not particularly limited, and may include, for example, a physical cleaning step using a frictional force or ultrasonic waves, or a chemical cleaning step using an acid solution and basic solution, to remove surface impurities.

In FIG. 4B, the surface of the focus ring 120 may be flattened through the first cleaning step. The surface of the focus ring 120 may be flattened by performing the pre-grinding step and the first cleaning step with respect to the damaged part 112 of FIG. 4A, and thus the reproduced part may be uniformly deposited in the reproduced part forming step that will be further described below.

The masking step may be performed to secure a grinding reference point when redeposition is performed using a CVD scheme in the reproduced part forming step. When the post-grinding step is performed by grinding the damaged component towards a masked part and a grinder reach the masked part, a position of the focus ring 110 may be secured based on the unetched parts, a mask, for example, a jig, may be removed, and other parts may be ground.

The masking step also may be performed to prevent deposition on the unetched parts corresponding to undamaged surfaces of the damaged focus ring 110 of FIG. 4A when a deposition lump is formed as shown in FIG. 4E through the reproduced part forming step. Thus, it is possible to avoid grinding of an unnecessary part in the post-grinding step, to increase an efficiency of the process.

FIG. 4F is a cross-sectional view of a focus ring from which masks are removed after the reproduced part forming step. For example, when there is no mask, a grinding reference point may not be secured when a deposition lump is formed in the reproduced part forming step, and a problem of needing to form a completely new component may occur. Accordingly, by performing the masking step, it is possible to secure an efficiency of a post-grinding step of a reproduced part formed of a difficult-to-grind deposition material with a relatively high resistance to plasma. According to an example embodiment, an area to be ground may be remarkably reduced in comparison to manufacturing of a complete semiconductor with a new component, and thus it is possible to reduce a unit cost of production of a component. Also, ultimately, a low price of a semiconductor product may be secured, and thus it is possible to significantly increase industrial utilization.

A masking material may include, for example, graphite materials, and a material that may be easily ground in comparison to the deposition material. Thus, unlike the deposition material, the masked part may be easily removed from the component.

The masking step may be performed by a jig as shown in FIG. 4C. The masking step may be performed by a jig configured to support one side of the damaged component. The jig may include a base jig 210 configured to support one surface among undamaged surfaces of the damaged focus ring 120. Also, the jig may further include an additional jig configured to support another surface among the undamaged surfaces.

In the masking step, at least one undamaged surface among a bottom surface, an outer surface and an inner surface of the damaged component may be masked.

FIG. 4D is a cross-sectional view of the focus ring 120 masked by the base jig 210 and additional jigs 300 for the outer surface 116 and the inner surface 118 in the masking step. Accordingly, a damaged part of the damaged component may be exposed and directly covered by the reproduced part. An undamaged part of the damaged component may be masked, and may not be in direct contact with the reproduced part.

As shown in FIG. 4E, a reproduced part 400, that is, a deposition lump may be formed on the damaged component after the masking step. The reproduced part 400 may be formed at a deposition temperature of 1000° C. to 1500° C. and a deposition rate of 20 micrometers (μm)/hour to 400 μm/hour and deposition gas may stay for a period of 7 seconds (s) to 110 s. A deposition lump may be formed on all surfaces of a focus ring as shown in FIG. 4E, and thus a reproduced component including a reproduced part may not be ground to be unsuitable for a standard of a product required in a field.

In the post-grinding step, the reproduced component that is thickened due to deposition of the reproduced part may be standardized so that a component damaged by a plasma etching apparatus may be replaced. Because a difficult-to-grind material, for example, silicon carbide (SiC), is deposited as a reproduced part, directly minimizing of a grinding area in a standardization process through the post-grinding step may be enormously important to secure a productivity of products. In the masking step, a part including an undamaged surface may be masked to secure an efficiency of the post-grinding step. FIG. 4F illustrates a focus ring standardized by easily grinding a part that is masked and that is used as a grinding reference point. A part that is not masked may be finally ground as shown in FIG. 4F. In the second cleaning step, surface impurities generated by the post-grinding step may be removed. FIG. 4G is a cross-sectional view of a focus ring standardized through the post-grinding step and the second cleaning step. Thus, a reproduced focus ring that has the same specification as and is substitutable for the focus ring 100 of FIG. 2 that is not damaged, may be secured with a high production efficiency.

The pre-grinding step, the post-grinding step or both may include cutting or grinding the damaged component with a diamond wheel. A component and a reproduced part may be formed of a difficult-to-grind material including SiC. Thus, in the pre-grinding step, the post-grinding step or both, a grinding tool may be used to cut or grind the damaged component. The grinding tool may be formed of a high hardness material that enables grinding due to a hardness higher than the component and the reproduced part, and may include, for example, a wheel made of diamond with a high hardness.

In the pre-grinding step, a damaged part of the damaged component may be cut or ground by a thickness of 0.8 millimeters (mm) to 1.7 mm. The damaged part 112 of FIG. 4A may have an average height deviation of about 0.5 mm. Accordingly, the damaged part may desirably be cut or ground by the thickness of 0.8 mm to 1.7 mm so that the damaged part may have a flat surface. However, there is no limitation thereto, and accordingly the thickness may be determined based on a state of a damaged surface.

In the post-grinding step, a surplus part may be acquired by cutting the reproduced part. The surplus part may be ground and used to manufacture a separate component.

Figure 5:
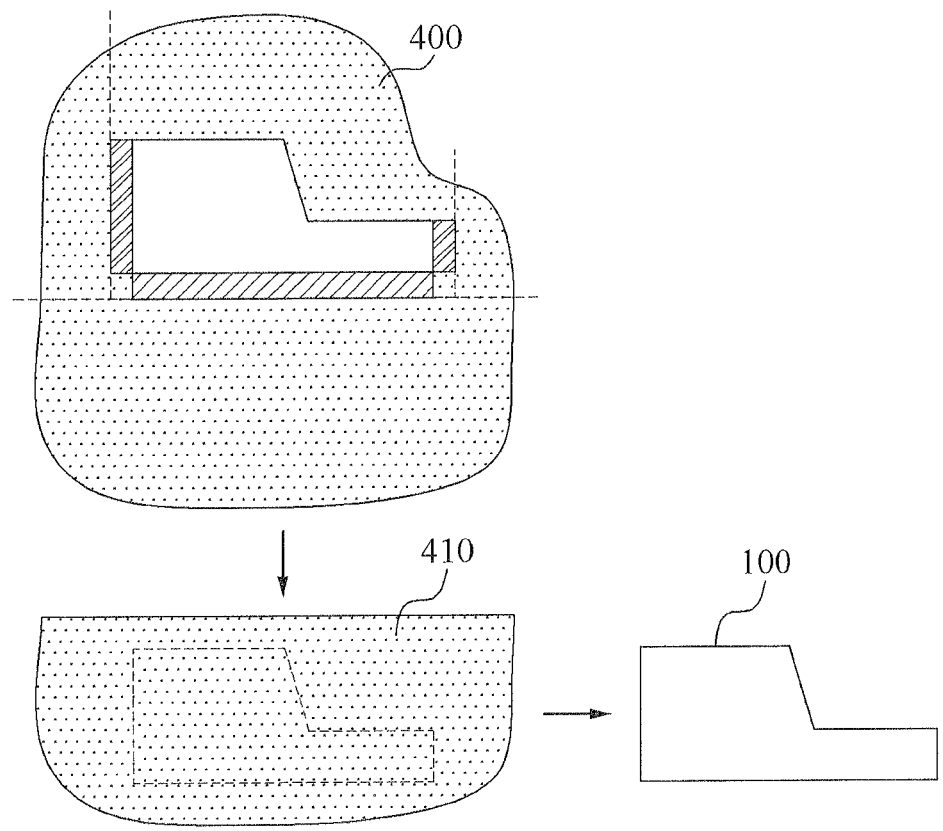
FIG. 5 is a diagram illustrating a process of acquiring a surplus part by cutting a reproduced part in a post-grinding step and of manufacturing a separate component by grinding the surplus part according to an example embodiment.

FIG. 5 is a diagram illustrating a process of acquiring a surplus part 410 by cutting a reproduced part 400 in a post-grinding step and of manufacturing a separate component by grinding the surplus part 410 according to an example embodiment. To increase an efficiency of a production process, a part may be acquired as a surplus part by cutting or grinding a formed reproduced part to be discarded, and the surplus part may be ground, to manufacture a separate component. A reproduction process may be performed by deposition, and the deposition may be nonselectively performed on an undamaged surface as well as a damaged surface. For example, SiC deposited on an undamaged surface may be separated and acquired and may be used as a material of another component before grinding.

The second cleaning step may include a first physical or chemical cleaning step, a heat treatment cleaning step, and a second physical or chemical cleaning step. In the present disclosure, the first physical or chemical cleaning step and the second physical or chemical cleaning step are not particularly limited, and may include, for example, a physical cleaning step using ultrasonic waves, or a chemical cleaning step using a solution including an acid, a base and distilled water. The first physical or chemical cleaning step and the second physical or chemical cleaning step may be performed to remove impurities remaining on a surface of a component. The heat treatment cleaning step may be a step of increasing a temperature for the second physical or chemical cleaning step to clean impurities that still remain after the first physical or chemical cleaning step.

A temperature of the heat treatment cleaning step may range from 800° C. to 1400° C. By adjusting the temperature of the heat treatment cleaning step based on a deposition material, impurities that still remain after the first physical or chemical cleaning step may be additionally cleaned. When the temperature of the heat treatment cleaning step is lower than 800° C., it may be difficult to sufficiently clean the remaining impurities. When the temperature of the heat treatment cleaning step exceeds 1400° C., a unit cost of production may increase in a process design for excessively increasing the temperature.

Also, according to an example embodiment, an apparatus for reproducing a component may be provided. Hereinafter, an apparatus for reproducing a component may be referred to as a "reproduction apparatus." The reproduction apparatus may include a CVD chamber, and a mask that is located in the CVD chamber and that is configured to mask an area including an undamaged part of a damaged component. The reproduction apparatus may be, for example, an apparatus for depositing a material including SiC on a damaged component using a CVD scheme. The CVD chamber may have, for example, a shape with a closed structure for forming a space allowing a CVD to be performed.

The mask may include a jig. The jig may have, for example, all shapes to expose a damaged part by supporting an area including an undamaged part of the damaged component. For example, when the damaged component is mounted in the jig, a structure of covering the damaged part with a reproduced part using the CVD scheme may be formed. To uniformly form a reproduced part in the CVD chamber, the jig may have a structure for rotatably mounting a component.

The jig may include a base jig configured to support one surface of undamaged surfaces of the damaged component. An area of a contact surface between the base jig and the surface supported by the base jig may be less than or equal to an area of the surface.

Figure 6:
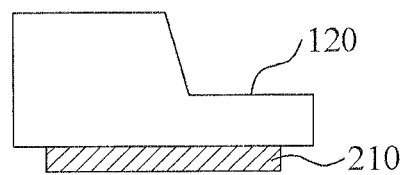
FIG. 6 is a cross-sectional view of a focus ring with a structure in which an area of a contact surface between a base jig of the focus ring and a surface supported by the base jig among undamaged surfaces of the focus ring is less than or equal to an area of the surface according to an example embodiment.

The base jig may have a structure to support a bottom of the damaged component, as shown in FIG. 6. Accordingly, a contact part between the base jig and a surface of the damaged component supported by the base jig may be covered during depositing and forming a reproduced part, and may not be deposited. An area of a surface of the base jig including the contact surface between the base jig and an undamaged surface of the damaged component may desirably be less than or equal to an area of the undamaged surface. For example, when the area of the contact surface exceeds the area of the undamaged surface, problems may occur as follows. An additional grinding may be required in the post-grinding step because a deposition material is deposited on a jig formed outside the damaged component, which may lead to a reduction in a process efficiency. Also, a deposition material may not be deposited on an edge between the damaged component and the jig or may be ununiformly deposited, and accordingly it may be impossible to substitute a reproduced component for a product that is not damaged. FIG. 6 is a cross-sectional view of a focus ring with a structure in which an area of a contact surface between a base jig 210 and a surface supported by the base jig 210 among undamaged surfaces of the focus ring is less than or equal to an area of the surface.

For example, the base jig may be a point jig. In this example, the point jig may be a jig in line or point contact with the damaged component. The point jig may function to secure a grinding reference point in a grinding step after a reproduced part of the damaged component is formed. Thus, by grinding a difficult-to-grind material of the reproduced part, it is possible to minimize an unnecessary grinding area and to verify a position of an undamaged area of a damaged component in a related art.

FIG. 7 is a cross-sectional view of a focus ring and a point jig 212 configured to support one of undamaged surfaces of the focus ring according to an example embodiment. In FIG. 7, the point jig 212 may support an area including an undamaged part of a damaged component by at least one line or point contact with the area. In the present disclosure, the point jig 212 is not particularly limited, and may have, for example, a structure for supporting the damaged component by a line or point contact with the area including the undamaged part of the damaged component. For example, the point jig 212 may be in contact with the area by a single line or a single point or by at least two lines or at least two points. In FIG. 7, the point jig 212 may be in contact with the area by lines of an inner circle and an outer circle.

The jig may further include an additional jig configured to support another undamaged surface of the damaged component. The reproduction apparatus may include the additional jig, and accordingly the damaged component may be more stably supported in a step of forming a reproduced part. Also, an undamaged surface of the damaged component may be disposed in a direction of the additional jig, and thus it is possible to prevent an additional deposition on another undamaged surface.

The additional jig may include an outer circumferential jig configured to support an outer surface of the damaged component, and an inner circumferential jig configured to support an inner surface of the damaged component.

FIGS. 8A and 8B are cross-sectional views of damaged focus rings masked by a base jig and additional jigs according to an example embodiment. In FIG. 8A, a bottom surface and an outer surface of a focus ring 120 are masked by a base jig 210 and an outer circumferential jig 220, respectively. In FIG. 8B, the bottom surface, the outer surface and an inner surface of a damaged focus ring are masked by the base jig 210, the outer circumferential jig 220 and an inner circumferential jig 230, respectively.

According to an example embodiment, an additional jig of a reproduction apparatus may include either an outer circumferential jig or an inner circumferential jig as a side jig as necessary based on a structure of the reproduction apparatus.

When a reproduced part is formed in a damaged focus ring among components, undamaged surfaces may be supported and masked by additional jigs (for example, side jigs), for example, the outer circumferential jig 220 and the inner circumferential jig 230 of FIGS. 8A and 8B. Thus, it is possible to form a stable support structure by masking to prevent an unnecessary deposition and to induce a direct deposition to be performed on a damaged surface.

According to an example embodiment, a base jig and an additional jig may be integrally formed, that is, may be formed as a single jig. For example, when a damaged component is freely detached or attached from a jig, the base jig and the additional jig may be integrally formed as necessary based on the structure of the reproduction apparatus.

Figure 9:
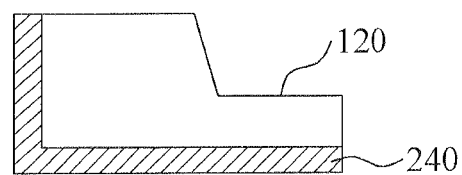
FIG. 9 is a cross-sectional view of a damaged focus ring with a structure in which a base jig and an additional jig are integrally formed to mask the damaged focus ring according to an example embodiment.

FIG. 9 is a cross-sectional view of a focus ring 120 with a structure 240 in which a base jig and an additional jig are integrally formed according to an example embodiment. In an example, a base jig and an outer circumferential jig may be integrally formed as shown in FIG. 9. In another example, a bottom jig, an outer circumferential jig and an inner circumferential jig may be integrally formed.

A shape of a surface of an additional jig in contact with a damaged component may correspond to a shape of a surface of the damaged component supported by the additional jig. The damaged component may have various shapes based on a function and role of the damaged component. Desirably, the additional jig may be formed so that a shape of a surface of the additional jig in contact with the damaged component may correspond to a shape of a surface of the damaged component, to have a structure to completely block the surface of the damaged component from a deposition material. Thus, an area of a surface to be ground in the post-grinding step may be reduced by completely blocking the surface of the damaged component from the deposition material during forming of a reproduced part.

Figure 10:
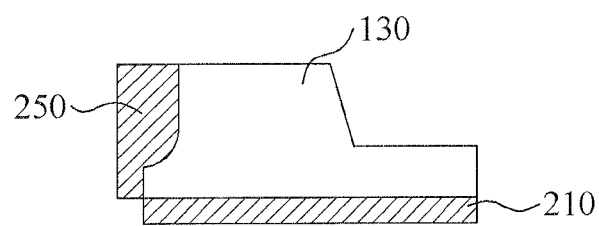
FIG. 10 is a cross-sectional view of a damaged focus ring with a structure in which a shape of a surface of an additional jig in contact with the damaged focus ring corresponds to a shape of a side of the damaged focus ring according to an example embodiment.

FIG. 10 is a cross-sectional view of a damaged focus ring 130 in contact with an additional jig 250 according to an example embodiment. In FIG. 10, a shape of a surface of the additional jig 250 in contact with the focus ring 130 may correspond to a shape of a side of the focus ring 130. For example, a lower portion of an outer surface of a focus ring may protrude from the focus ring based on a type of a plasma etching apparatus. In this example, the additional jig 250 may be formed to have a shape corresponding to the protruding portion and may be in completely close contact with the focus ring. Thus, it is possible to completely block one side of the focus ring 130 in addition to a bottom surface of the focus ring 130 masked and covered by a base jig 210 from a deposition material during forming of a reproduced part.

According to an example embodiment, a reproduced component as a consumable component may be provided. The reproduced component may include a reproduced part and a nonreproduced part. The reproduced component as a consumable component may include, for example, a component required to be replaced when the component is damaged by plasma in a plasma etching apparatus for manufacturing a semiconductor wafer.

The nonreproduced part, the reproduced part or both may be resistant to plasma. The nonreproduced part, the reproduced part or both may be exposed to plasma and etched, to be damaged. For example, a damaged component may need to be replaced, and accordingly production costs of a semiconductor product may increase due to frequently replacing. To reduce the production costs, the nonreproduced part, the reproduced part or both may desirably be formed of materials resistant to plasma.

The nonreproduced part, the reproduced part or both may include SiC. The nonreproduced part, the reproduced part or both may desirably include SiC among various materials that are resistant to plasma and that have been studied up to now. For example, the SiC may be a material with a strong covalent bond, and may have an excellent resistance to plasma as well as a heat conductivity, a hardness, an oxidation resistance, a wear resistance and a corrosion resistance, in comparison to other ceramic materials. Also, the SiC may have excellent properties as a material for manufacturing a semiconductor that requires a precise process under a severe condition.

Also, the nonreproduced part, the reproduced part or both may include SiC, and may further include another material including hydrocarbon. The hydrocarbon may have chemical formula CxHy in which x is an integer greater than or equal to "1" and y is an integer greater than or equal to "2." The focus ring may have a structure in which an SiC substrate is coated with a silicon layer.

The nonreproduced part and the reproduced part may have the same materials. When the nonreproduced part and the reproduced part have the same materials, a product substitutable for an initial component that is not damaged may be manufactured. Also, a material of the reproduced part may be resistant to plasma unlike a material of the nonreproduced part, and accordingly the reproduced part may include a material with physical properties superior to physical properties of the nonreproduced part, as necessary.

Also, the nonreproduced part and the reproduced part may have the same material as that of a wafer to be generated, because when the reproduced part has a completely different material from that of a wafer to be manufactured, and when a component is damaged by plasma, the material of the reproduced part may leak and contaminate the wafer. A component element of a damaged component before the reproduced part is formed may be the same as or different from a component element of the reproduced part. Because the nonreproduced part, the reproduced part or both include SiC, a flexural rigidity may significantly increase and a high corrosion resistance to plasma may be secured.

The reproduced part may be formed using various schemes including a CVD scheme. The reproduced part may desirably have a thickness of 0.5 μm to 5 μm. When the thickness of the reproduced part is less than 0.5 μm, an actual effect realized by forming the reproduced part may not exist. When the thickness of the reproduced part is greater than or equal to 5 μm, an economic feasibility of a reproduction process may decrease. In addition, the reproduced part may more desirably have a thickness of 1 μm to 3 μm.

The reproduced component may be used as a component of a plasma etching apparatus, and may include at least one of a ring, an electrode and a conductor. The reproduced component may include, for example, a focus ring, an upper electrode, a ground electrode, a shower head or an outer ring. The reproduced component may include all various components exposed to plasma in the plasma etching apparatus. Among the various components, a focus ring, an upper electrode, a ground electrode and an outer ring may have a high probability of being damaged by plasma in the plasma etching apparatus, and accordingly may correspond to a reproduced component of the present disclosure.

According to an example embodiment, a method of reproducing a component may be performed by a reproduction apparatus. Based on the above-described structure of the reproduction apparatus, steps of the method may be more efficiently performed.

Also, according to an example embodiment, a reproduced component may be a component reproduced using a method of reproducing a component. By performing steps of the method, it is possible to more efficiently provide a reproduced component.

In addition, according to an example embodiment, a reproduced component may be a component reproduced using a reproduction apparatus. Based on a structure of the reproduction apparatus, it is possible to more efficiently provide a reproduced component.

According to example embodiments, in a method of reproducing a component of a semiconductor manufacturing apparatus, a reproduced part may be formed in a component to be discarded after replacement, and thus it is possible to realize a process production efficiency greater than or equal to a replacement by a new product with relatively low costs, which may lead to a reduction in production costs of semiconductor products and a reduction in a mass production of industrial wastes. Also, a reproduction apparatus and a reproduced component may have an effect of reproducing a damaged component using an efficient structure and method.

Furthermore, according to example embodiments, a separate component of a semiconductor manufacturing apparatus may be manufactured using a surplus part formed after deposition during a reproduction process, and thus it is possible to expect an effect of increasing a productivity.

Although a few embodiments of the present disclosure have been shown and described, the present disclosure is not limited to the described embodiments. Instead, it would be appreciated by those skilled in the art that changes may be made to these embodiments without departing from the principles and spirit of the present disclosure, the scope of which is defined by the claims and their equivalents.

What is claimed is:

1. A method of reproducing a component of a semiconductor manufacturing apparatus, the method of:
   a preparing step of preparing a damaged component of a semiconductor manufacturing apparatus;
   a first cleaning step of cleaning the damaged component;
   a masking step of masking at least one area of a surface of the damaged component using a jig in which an area of contact between the jig and the undamaged surface of the damaged component is less than or equal to an area of the undamaged surface, wherein the base jig is a point jig;
a reproduced part forming step of forming a reproduced part on the damaged component using a chemical vapor deposition (CVD);
a post-grinding step of grinding the damaged component with the reproduced part; and
a second cleaning step of cleaning the damaged component with the reproduced part.

2. The method of claim 1, further comprising, between the preparing step and the first cleaning step:
a pre-grinding step of grinding the damaged component.

3. The method of claim 2, wherein the pre-grinding step, the post-grinding step or both comprise cutting or grinding the damaged component with a diamond wheel.

4. The method of claim 2, wherein the pre-grinding step comprises cutting or grinding a damaged part of the damaged component by a thickness of 0.8 millimeters (mm) to 1.7 mm.

5. The method of claim 1, wherein the masking step comprises masking at least one undamaged surface selected from the group consisting of a bottom surface, an outer surface and an inner surface of the damaged component.

6. The method of claim 1, wherein the post-grinding step comprises acquiring a surplus part by cutting the reproduced part, and
wherein the surplus part is ground to manufacture another component of the semiconductor manufacturing apparatus.

7. The method of claim 1, wherein the second cleaning step comprises a first physical or chemical cleaning step, a heat treatment cleaning step, and a second physical or chemical cleaning step, and
wherein a temperature of the heat treatment cleaning step ranges from 800° C. to 1400° C.

8. The method of claim 1, wherein the method is performed using an apparatus which comprises:
a chemical vapor deposition (CVD) chamber; and
a mask located in the CVD chamber and configured to mask an area comprising an undamaged part of a damaged component.

9. A method of reproducing a component of a semiconductor manufacturing apparatus, the method comprising:
a preparing step of preparing a damaged component of a semiconductor manufacturing apparatus;
a first cleaning step of cleaning the damaged component;
a masking step of masking at least one area of an undamaged part of the damaged component;
a reproduced part forming step of forming a reproduced part on the damaged component using a chemical vapor deposition (CVD);
a post-grinding step of grinding the damaged component with the reproduced part; and
a second cleaning step of cleaning the damaged component with the reproduced part,
wherein the post-grinding step comprises acquiring a surplus part by cutting the reproduced part, and
wherein the surplus part is ground to manufacture another component of the semiconductor manufacturing apparatus.

10. The method of claim 9, further comprising, between the preparing step and the first cleaning step:
a pre-grinding step of grinding the damaged component.

11. The method of claim 9, wherein the masking step comprises masking at least one of the areas by a jig.

12. The method of claim 9, wherein the masking step comprises masking at least one undamaged surface selected from the group consisting of a bottom surface, an outer surface and an inner surface of the damaged component.

13. The method of claim 10, wherein the pre-grinding step, the post-grinding step or both comprise cutting or grinding the damaged component with a diamond wheel.

14. The method of claim 10, wherein the pre-grinding step comprises cutting or grinding a damaged part of the damaged component by a thickness of 0.8 millimeters (mm) to 1.7 mm.

15. The method of claim 9, wherein the second cleaning step comprises a first physical or chemical cleaning step, a heat treatment cleaning step, and a second physical or chemical cleaning step, and
wherein a temperature of the heat treatment cleaning step ranges from 800° C. to 1400° C.

16. The method of claim 9, wherein the method is performed using an apparatus which comprises:
a chemical vapor deposition (CVD) chamber; and
a mask located in the CVD chamber and configured to mask an area comprising an undamaged part of a damaged component.

* * * * *